(12) United States Patent
Rahman

(10) Patent No.: US 8,237,274 B1
(45) Date of Patent: Aug. 7, 2012

(54) INTEGRATED CIRCUIT PACKAGE WITH REDUNDANT MICRO-BUMPS

(75) Inventor: Arifur Rahman, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 12/779,806

(22) Filed: May 13, 2010

(51) Int. Cl.
H01L 23/48 (2006.01)
H01L 23/52 (2006.01)
H01L 29/40 (2006.01)
H01L 21/44 (2006.01)

(52) U.S. Cl. ........ 257/737; 257/693; 257/778; 257/786; 257/E23.02; 257/E23.021; 257/E21.023; 257/E21.508; 438/613

(58) Field of Classification Search ............... None
See application file for complete search history.

(56) References Cited

U.S. PATENT DOCUMENTS

| | | | | |
|---|---|---|---|---|
| 3,517,278 A | * | 6/1970 | Hager | 257/778 |
| 5,329,423 A | * | 7/1994 | Scholz | 361/760 |
| 5,834,366 A | | 11/1998 | Akram | |
| 6,365,978 B1 | * | 4/2002 | Ibnabdeljalil et al. | 257/786 |
| 6,700,207 B2 | * | 3/2004 | Pekin et al. | 257/778 |
| 6,979,896 B2 | * | 12/2005 | Seshan | 257/691 |
| 6,998,711 B1 | | 2/2006 | Farrar | |
| 7,302,757 B2 | | 12/2007 | Brody et al. | |
| 2003/0143872 A1 | * | 7/2003 | Keller | 439/71 |
| 2003/0218246 A1 | * | 11/2003 | Abe et al. | 257/734 |
| 2006/0063371 A1 | * | 3/2006 | Lin et al. | 438/618 |
| 2006/0063378 A1 | * | 3/2006 | Lin et al. | 438/642 |
| 2007/0182019 A1 | * | 8/2007 | Nishimura | 257/777 |

FOREIGN PATENT DOCUMENTS

| | | |
|---|---|---|
| JP | 10-233401 | * 9/1998 |
| JP | 2000-286295 | * 10/2000 |

* cited by examiner

*Primary Examiner* — Hoang-Quan Ho
(74) *Attorney, Agent, or Firm* — LeRoy D. Maunu; Thomas George

(57) ABSTRACT

A semiconductor device is provided that includes a substrate having opposing first and second surfaces and an interconnect structure extending between the first and second surfaces. A plurality of bond pads are located on the first surface of the substrate and the bond pads are electrically connected to the interconnect structure. The bond pads each have two or more micro-bumps, with the two or more micro-bumps on each bond pad being arranged to electrically connect the bond pad to one die pad of a semiconductor die. A plurality of external contacts are located on the second surface of the substrate and the external contacts are electrically connected to the interconnect structure.

20 Claims, 5 Drawing Sheets

US 8,237,274 B1

INTEGRATED CIRCUIT PACKAGE WITH REDUNDANT MICRO-BUMPS

FIELD OF THE INVENTION

One or more embodiments of the present invention generally relate to integrated circuit packages, and more particularly, to redundant micro-bumps that connect semiconductor die to an interposer.

BACKGROUND

Programmable logic devices (PLDs) are a type of programmable integrated circuit (IC) that can be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes configurable logic blocks (CLBs), programmable input/output blocks (IOBs), and other types of logic blocks, such as memories, microprocessors, digital signal processors (DSPs), and the like. The CLBs, IOBs, and other logic blocks are interconnected by a programmable interconnect structure. The programmable interconnect structure (also referred to as a routing fabric) typically includes conductors of various lengths interconnected by programmable switches (referred to as programmable routing resources). For example, some types of conductors may span two CLBs (referred to as doubles), while other types of conductors may span six CLBs (referred to as hexes). The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured. An FPGA may also include various dedicated logic circuits, such as digital clock managers (DCMs), input/output (I/O) transceivers, boundary scan logic, and the like.

As semiconductor technology has advanced, the amount and speed of logic available on an IC, such as an FPGA, has increased more rapidly than the number and performance of I/O connections. As a result, IC die stacking techniques have received renewed interest to address the interconnection bottleneck of high-performance systems. In stacked IC applications, two or more ICs are stacked vertically and interconnections are made between them.

The stacked ICs are packaged in modules before they are bonded to a carrier such a printed circuit board. The module consists of one or more IC dice bonded to an interposer. One technique for connecting the IC dice to the interposer is thermal compression bonding. A single solder bump (e.g., a micro-bump) is deposited on each bond pad on the interposer to form the bonds between the IC die and the interposer. The IC die is pressed to the interposer by a thermal compression bonding tool and heat is applied to fuse the IC die to the interposer. Additional IC dice can also be connected to the interposer in the same manner. The IC package is then bonded to a carrier using, for example, the Controlled Collapse Chip Connection (C4) process. The above described types of bonding process are also often referred to as flip-chip bonding.

In order to improve bonding yield between the IC dice and the interposer in the flip-chip bonding process, redundant micro-bumps are added to the interposer for each pad on the IC dice. While the use of redundant micro-bumps improves bonding yield, it also increases area overhead due to the corresponding increase in the number of pads on the interposer needed for each of the redundant micro-bumps. For example, if a redundant micro-bump is used for each connection between the interposer and the IC dice, the area overhead increases linearly with the number of redundant micro-bumps. As such, the addition of redundant micro-bumps decreases the number of input/output connections that can be formed between the IC dice and the interposer.

The present invention may address one or more of the above issues.

SUMMARY

According to an example embodiment of the present invention, a semiconductor device includes a substrate having opposing first and second surfaces and an interconnect structure extending between the first and second surfaces. A plurality of bond pads are located on the first surface of the substrate and the bond pads are electrically connected to the interconnect structure. The bond pads each have two or more micro-bumps, with the two or more micro-bumps on each bond pad being arranged to electrically connect the bond pad to one die pad of a semiconductor die. A plurality of external contacts are located on the second surface of the substrate and the external contacts are electrically connected to the interconnect structure.

According to another example embodiment of the present invention, an integrated circuit package includes a substrate having opposing first and second surfaces and an interconnect structure extending between the first and second surfaces. A plurality of bond pads are located on the first surface of the substrate and the bond pads are electrically connected to the interconnect structure. The bond pads each have two or more micro-bumps. A plurality of contacts are located on the second surface of the substrate and the contacts are electrically connected to the interconnect structure.

According to yet another example embodiment of the present invention, a method for fabricating a semiconductor device includes: forming a plurality of bond pads on a first surface of a substrate, where the substrate has the first surface and an opposing second surfaces and an interconnect structure extends between the first and second surfaces, and the bond pads are electrically connected to the interconnect structure. The method also includes forming two or more micro-bumps on each of the bond pads, where the two or more micro-bumps on each bond pad are arranged to electrically connect the bond pad to one die pad of a semiconductor die. In addition, the method includes forming external contacts on the second surface of the substrate, where the external contacts are electrically connected to the interconnect structure.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

One or more embodiments of the present invention provide a semiconductor package including a plurality of IC chips that are bonded to an interposer. Redundant micro-bumps are used for each electrical contact between the IC chips and the interposer, with the redundant micro-bumps being placed on the same bond pads on the interposer. Such a layout of redundant micro-bumps reduces the area overhead of the redundant micro-bumps and increases micro-bump density while also improving bonding yield due to the redundancy.

Figure 1:
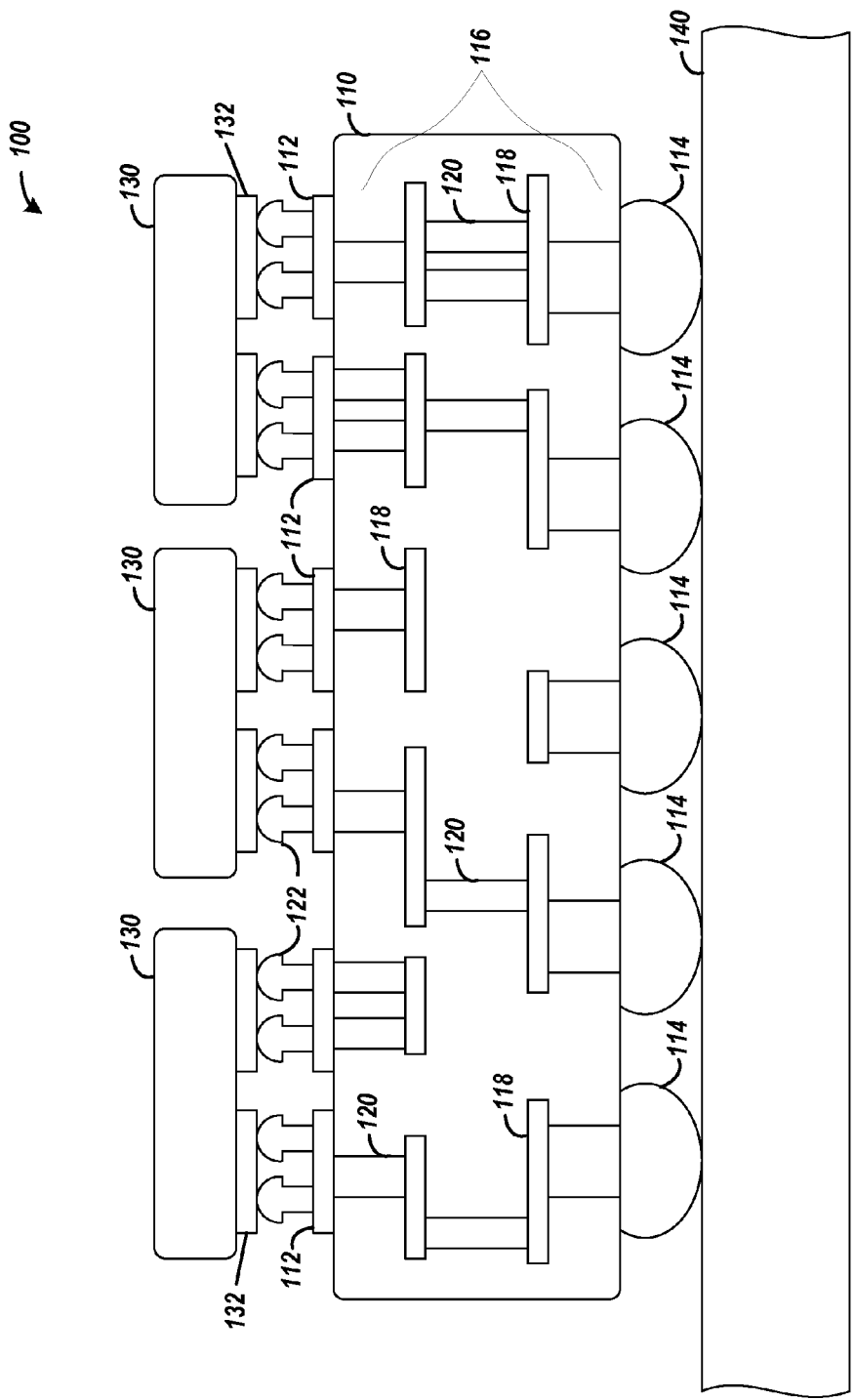
FIG. 1 shows a cross sectional view of an integrated circuit (IC) package, according to an example embodiment of the present invention.

FIG. 1 is a cross sectional view of an integrated circuit (IC) package 100, according to an example embodiment of the present invention. The IC package 100 includes an interposer 110 and a plurality of semiconductor dice 130 bonded to the interposer 110. The interposer 110 has a plurality of bond pads 112 on one surface and a plurality of bump contacts 114 on the other surface for flip mounting to a carrier 140. An interconnect structure 116 electrically connects each of the bond pads 112 to a corresponding one of the bump contacts 114. The interconnect structure 116 is composed of multiple metallization layers 118 that are connected by a plurality of vias 120. The interposer 110 includes additional bond pads 112 and bump contacts 114 that are not illustrated in FIG. 1. As such, some of the bond pads 112 shown in FIG. 1 are connected by the interconnect structure 116 to corresponding bump contacts 114 that are not shown in FIG. 1. Also, one of the bump contacts 114 shown in FIG. 1 is connected by the interconnect structure 116 to a corresponding bond pad 112 that is not shown in FIG. 1.

The semiconductor dice 130 each include circuitry formed on a semiconductor die. The semiconductor dice 130 also each include conductive interconnect formed over the circuitry, which include die pads 132. The semiconductor dice 130 can be any type of digital, analog, or mixed-single IC including, for example, field-programmable gate arrays (FPGAs), digital signal processors, multi-purpose processing units and memory modules. The semiconductor dice 130 are vertically stacked with interposer 110. In one implementation, each of the semiconductor dice 130 is configured for face-down mounting in flip-chip fashion. The term face side denotes the side of a die that receives the bulk of semiconductor processing such that circuitry is fabricated on that face side of the die. The side of a die opposite the face side is referred to as the backside of the die. Thus, the face side of semiconductor dice 130 is mounted to interposer 110.

The semiconductor dice 130 each have multiple die pads 132 that are each physically and electrically connected to a corresponding one of the bond pads 112 on the interposer 110. The bond pads 112 each include two or more micro-bumps 122 that connect the bond pad 112 to a die pad 132 of one of the semiconductor dice 130. The redundant micro-bumps 122 for connecting to a single contact pad 131 of a semiconductor die are located on the same bond pad 112 of the interposer 110. The placement of the redundant micro-bumps 122 on the same bond pad 112, as opposed to being on separate one of the bond pads 112, decreases the area overhead required for the redundant micro-bumps 122, thereby allowing for an increase in the number and density of input/output (I/O) connections between the interposer 110 and the semiconductor dice 130. Although only three semiconductor dice 130 are shown stacked on the interposer 110, those skilled in the art will appreciate that more than or less than three semiconductor dice may be stacked on the interposer 110 and any combination of such stacked semiconductor dice may be coupled using redundant micro-bumps.

In one implementation, the semiconductor dice 130 are connected to the interposer 110 in the following manner. The semiconductor dice 130 are placed on top of the interposer 110 above the micro-bumps 122 with the die pads 132 of the semiconductor dice 130 resting on the micro-bumps 122 of the corresponding bond pads 112 on the interposer 110. The semiconductor dice 130 can be mounted on the micro-bumps 122 using flip-chip optical alignment techniques and apparatuses, as known to one of skill in the art. The IC package 100 is heated to melt solder of the micro-bumps 122 and thereby align the die pads 132 of the semiconductor dice 130 with the bond pads 112 of the interposer 110. The solder later hardens to form reliable bonds between the bond pads 112 and the die pads 132. The IC package 100 is then bonded to carrier 140 via the bump contacts 114. In another implementation, the IC package 100 is connected to a testing apparatus via the bump contacts 114. The testing apparatus includes probe pads for connection to test circuitry that is used to test the semiconductor dice 130.

Figure 2:
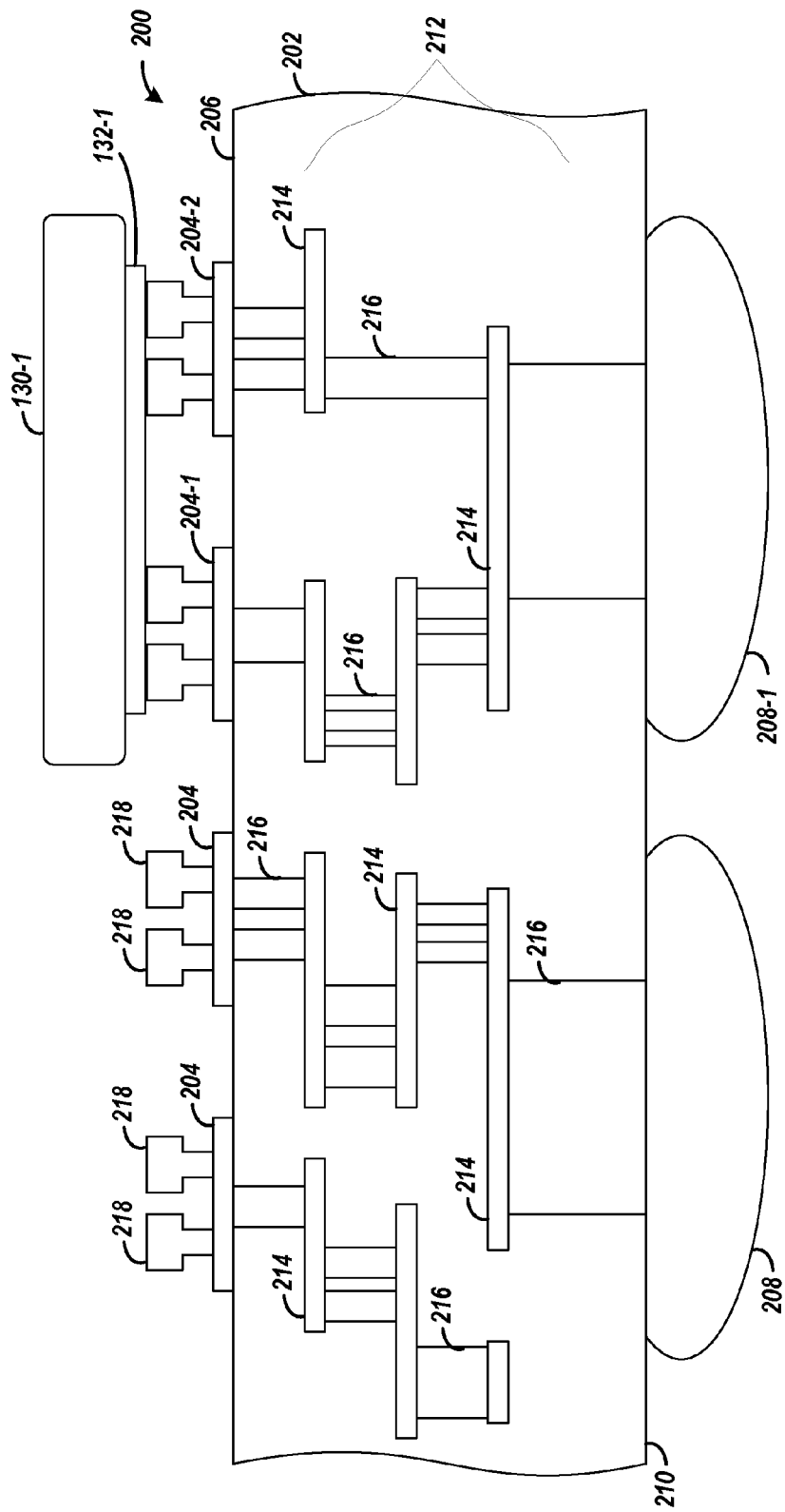
FIG. 2 shows a cross sectional view of a portion of an interposer in accordance with an embodiment of the invention.

FIG. 2 is a cross sectional view of a portion of an interposer 200, according to an example embodiment of the present invention. The interposer 200 includes a substrate 202 having a plurality of bond bonds 204 on surface 206 and a plurality of bump contacts 208 on surface 210. The substrate 202 can be formed of any suitable type of semiconductor material such as silicon.

An interconnect structure 212 electrically connects each of the bond pads 204 to a corresponding one of the bump contacts 208. The interconnect structure 212 is composed of multiple metallization layers 214 that are connected by a plurality of vias 216. The metallization layers 214 and the vias can be formed of any suitable type of conductive material. The interconnect structure 212 can be formed in a variety of manners including, for example, through deposition of conductive layers (e.g., chemical vapor deposition) and subsequent etching and/or chemical mechanical polishing steps or by a dual damascene process. The interposer 200 includes additional bond pads 204 and bump contacts 208 that are not illustrated in FIG. 2. As such, some of the bond pads 204 shown in FIG. 2 are connected by the interconnect structure 212 to corresponding bump contacts 208 that are not shown in FIG. 2.

The bond pads 204 each include two or more micro-bumps 218. The micro-bumps 218 are formed from any of a variety of materials including, but not limited to, copper, nickel, gold, palladium, and solder material such as PbSn, InSn and SbSn. Additional alloys based on tin (Sn), gold (Ag), copper (Cu) and indium (In) metallurgy can also be used as solder material for the micro-bumps 218. In one implementation, a cap layer of an inert metal, such as palladium, gold or platinum, is formed on the surface of the micro-bumps 216.

The micro-bumps 218 are formed using any one of a variety of techniques, as known to one of skill in the art. For example, micro-bumps 218 can be formed on the bond pads 204 using an electroplating process or an electroless plating process. Micro-bumps 218 of solder material can be formed on the bond pads 204 by a screen printing process or an evaporation process. Further details regarding processes of forming micro-bumps can be found in U.S. Pat. No. 5,834,366, which is hereby incorporated by reference in its entirety.

In one implementation, two of the bond pads 204-1 and 204-2 of the interposer 200 are connected by the interconnect structure 212 to the same contact 208-1. The two bond pads connected to the same bump contact are configured to be connected to a single die pad 132-1 of a semiconductor die 130-1, via the redundant microbumps on each of the two bond pads.

Figure 3:
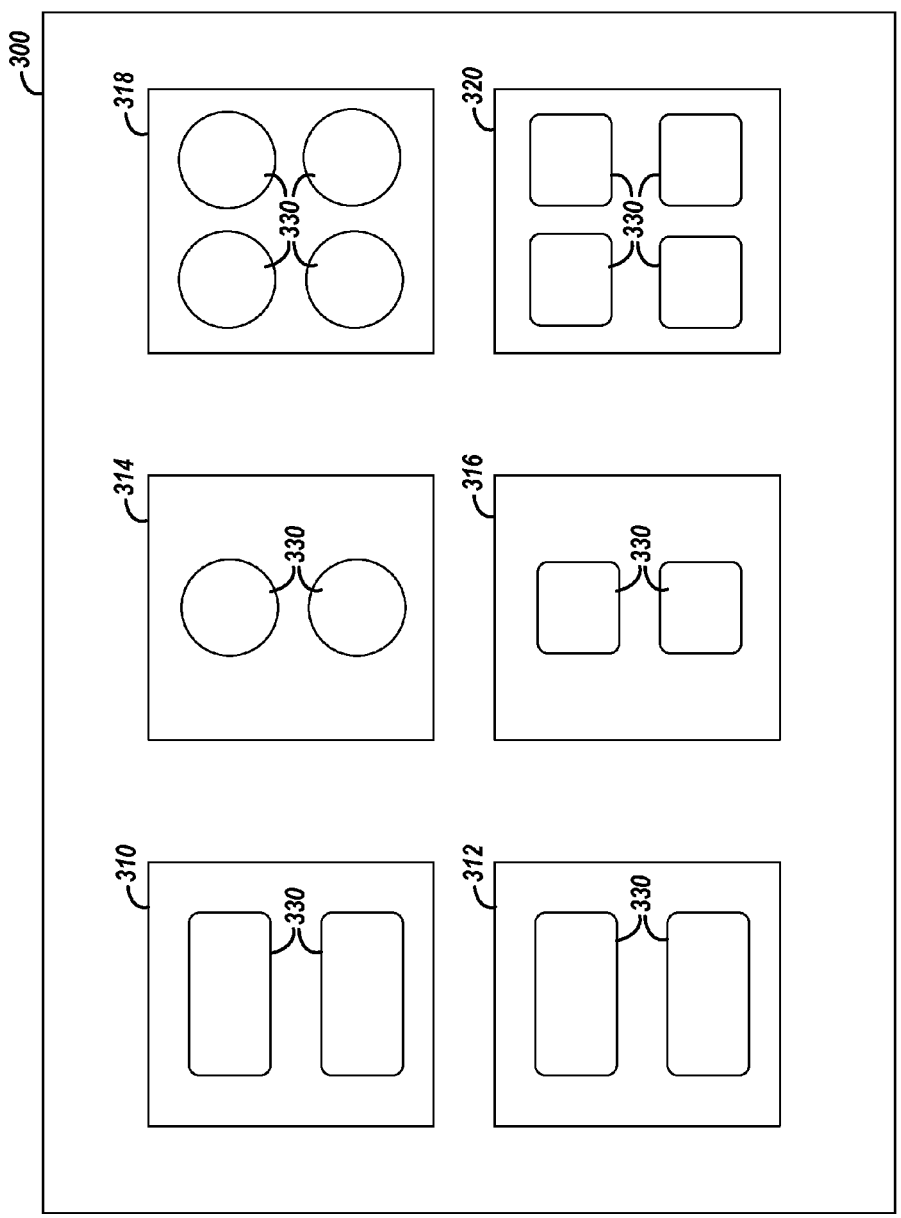
FIG. 3 shows a block diagram of a portion of the surface of an interposer, according to an example embodiment of the present invention.

FIG. 3 is a block diagram of a portion of the surface of an interposer 300, according to an example embodiment of the present invention. The interposer 300 has a plurality of bond bonds 310-320 on the surface and each of the bond bonds 310-320 contains two or more micro-bumps 330. The interposer 300 contains further bond pads in addition to those shown in FIG. 3. The redundant micro-bumps 330 share the same bond pad. In one implementation, the bond pads 310-320 contain different numbers of micro-bumps 330. Bond pads 310-316 each have two micro-bumps 330 and bond pads 318-320 each have four micro-bumps 330. In another implementation, each of the bond pads of the interposer 300 contains the same number of micro-bumps 330.

The micro-bumps 330 can have a variety of different shapes as shown in FIG. 3. The micro-bumps 330 on bond pads 310-312 have a rectangular shape, those on bond pads 314 and 318 have a circular shape and those on bond pads 316 and 320 have a square shape. The micro-bumps 330 are generally mushroom shaped as shown in FIGS. 1 and 2 with the micro-bumps 122 of FIG. 1 having a circular shaped top and the micro-bumps 218 of FIG. 2 having a rectangular shaped top.

The micro-bumps 330 can also be of different sizes. The following are example dimensions for bond pads 310 and 312 and their rectangular micro-bumps. The bond pads 310 and 312 have a length of 29 μm and a width of 39 μm. The rectangular top portions of the micro-bumps have a length of 22 μm and width of 12 μm, and the bottom portions of these micro-bumps have a length of 15 μm and width of 5 μm. The bond pads 310 and 312 are located 6 μm from each other and 16 μm from bond pads 314 and 316 respectively.

The sizes, shapes and numbers of the micro-bumps 330 on bond pads 310-320 in FIG. 3 are solely for illustration purposes. The micro-bumps 330 can be of any suitable size and shape depending on the size of the bond pads.

Figure 4:
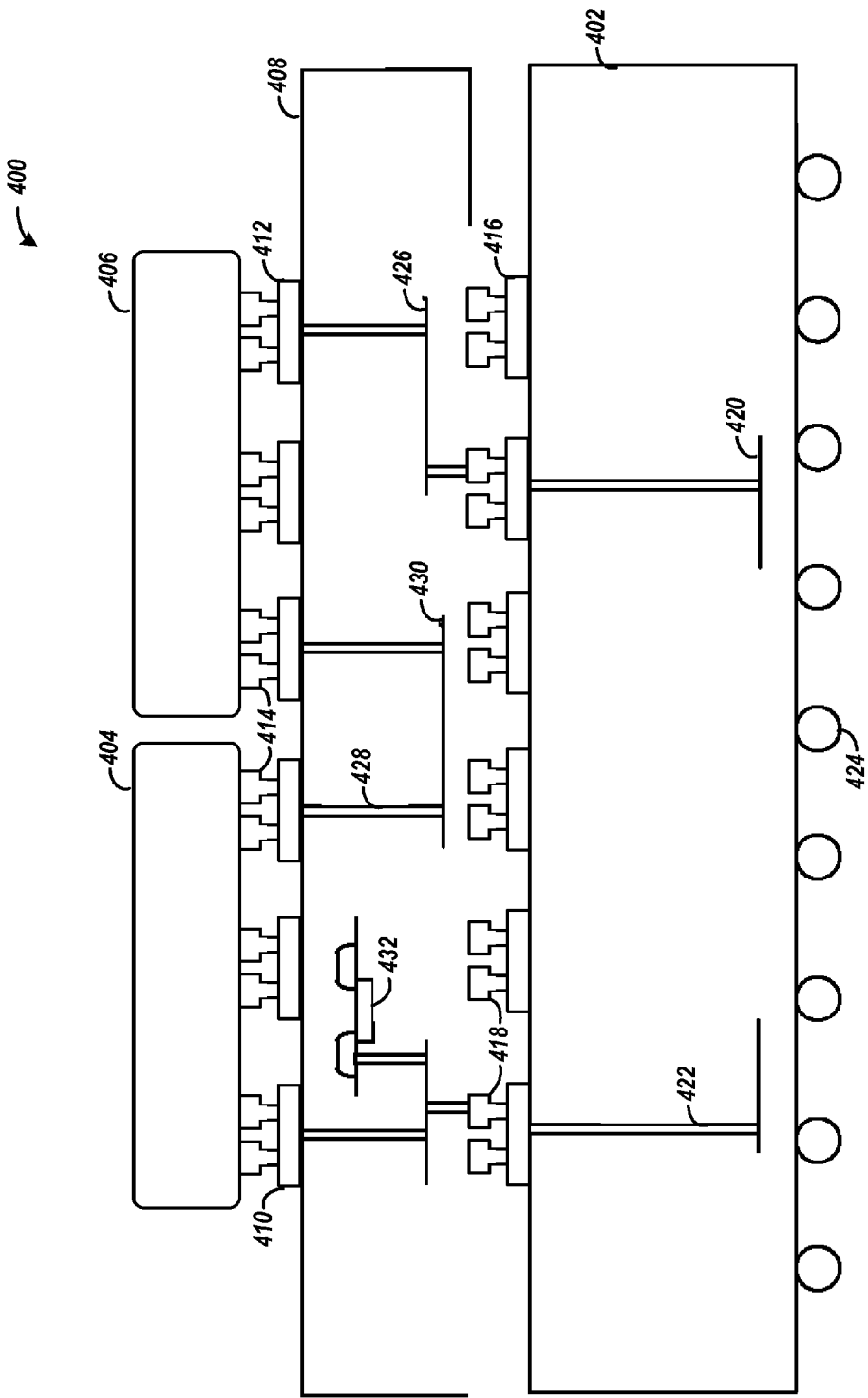
FIG. 4 is a cross-sectional view of a semiconductor device in accordance with one or more aspects of the invention.

FIG. 4 is a cross-sectional view a semiconductor device 400 in accordance with one or more aspects of the invention. The semiconductor device 400 includes an FPGA die 402, a second die 404, a third die 406, and an interposer 408. Each of the second die 404 and the third die 406 may comprise any type of digital, analog, or mixed-signal IC. The second die 404 and the third die 406 are vertically stacked on the interposer 408, which is in turn stacked on the FPGA die 402. In some embodiments, each of the die 402, 404, and 406 is configured for face-down mounting in flip-chip fashion. Thus, the face side of the second die 404, and the face side of the third die 406, may be mounted to the interposer 408, which is mounted to the backside of the FPGA die 402.

The second and third dice 404 and 406 each include circuitry formed on a semiconductor substrate. The second die 404 and the third die 406 also include conductive interconnect formed over the circuitry, as is conventionally known in the art. The interposer 408 includes an array of contacts 410 and an array of contacts 412, each formed on the backside thereof. The contacts 410 and 412 have multiple redundant micro-bumps 414 for connecting the contacts 410 and 412 to the second and third dice 404 and 406. The second die 404 is electrically and mechanically coupled via the micro-bumps 414 to the contacts 410. The third die 406 is electrically and mechanically coupled via the micro-bumps 414 to the contacts 412.

The FPGA die 402 includes an array of contacts 416 formed on the backside thereof. The contacts 416 each have multiple redundant micro-bumps 418 for connecting the contacts 416 to the interposer 408. The interposer 408 is electrically and mechanically coupled via the micro-bumps 418 to the contacts 416. The FPGA die 402 includes circuitry formed on a semiconductor substrate and conductive interconnect formed over the circuitry (portion 420 of the conductive interconnect is shown). The FPGA die 402 also includes through die vias (TDVs) 422 and an array of bump contacts 424 formed on the face side for flip-chip mounting to a carrier.

In one implementation, the interposer 408 comprises a silicon substrate having one or more layers of conductive interconnect formed thereon (portion 426 of conductive interconnect is shown). The interposer 408 also includes a plurality of TDVs extending from the backside thereof to the conductive interconnect on the face side thereof. For example, TDVs 428 are shown. The interposer 408 may be configured to provide routing resources between the second die 404 and the third die 406 (e.g., path 430). The interposer 408 is also configured to provide routing resources between the second die 404 and the FPGA die 402, and between the third die 406 and the FPGA die 402.

In some embodiments, the interposer 408 includes active circuitry defined thereon (represented by transistor 432). The active circuitry may include switches, level translation circuits, signal conditioning circuits, and the like. In such case, the routing resources may be programmable, such as the dedicated routing resources described above (either digital or analog resources with switches for isolation). The interposer 408 is also configured to provide routing resources between the second die 404 and the FPGA die 402, and between the third die 406 and the FPGA die 402. In other embodiments, the interposer 408 may comprise an optically-enabled interposer having embedded optical transmitters/receivers, embedded optical/electrical converters, embedded optical waveguides, and the like. Thus, the interposer 408 may facilitate optical communications between multiple ICs, including between IC(s) and the FPGA.

In another embodiment, the FPGA die 402 is configured to provide an electrical interconnection between the second die 404 and the third die 406. In one implementation, the FPGA die 402 and the interposer 408 both provide electrical interconnection between the second die 404 and the third die 406. In another implementation, the second die 404 and the third die 406 are electrically and mechanically coupled via the micro-bumps 418 directly to the contacts 416 of the FPGA die 402 without the use of an intervening interposer 408. Further details regarding an FPGA die being used to provide electrical interconnection between dice can be found in U.S. Pat. No. 7,619,441, which is hereby incorporated by reference in its entirety.

Figure 5:
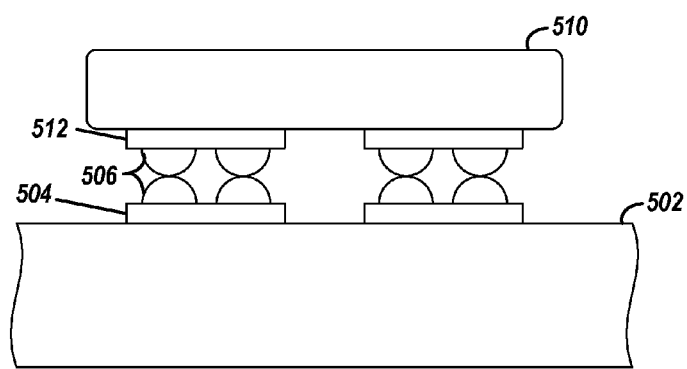
FIGS. 5 and 6 are cross sectional views of portions of an integrated circuit (IC) package, according to example embodiments of the present invention.
Figure 6:
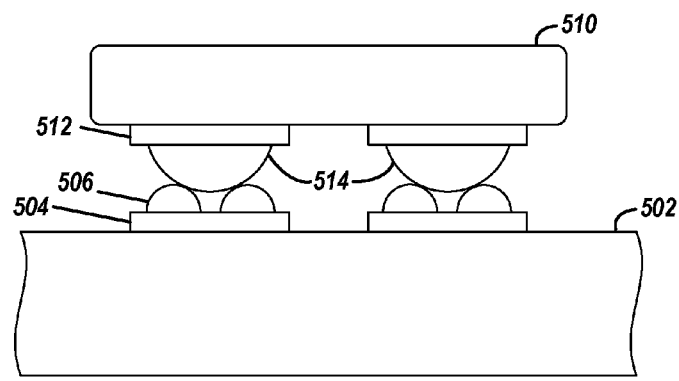

FIGS. 5 and 6 are cross sectional views of portions of an integrated circuit (IC) package, according to example embodiments of the present invention. FIGS. 5 and 6 illustrate the interface between an interposer 502 and a single semiconductor die 510, which are similar to the interposer 110 and the semiconductor dice 130 of FIG. 1. The interposer 502 has a plurality of bond pads 504 that each include two or more micro-bumps 506 that connect the bond pad 504 to a die pad 512 of the semiconductor die 510. For illustration purposes, the two or more micro-bumps 506 are shown as having a half circular shape in cross-section; however, the two or more micro-bumps 506 can be any of the variety of shapes. The die pads 512 of the semiconductor die 510 also have at least one bump contact that is connected to the two or more micro-bumps 506 on a respective one of the bond pads 504 of the interposer 502. In the embodiment shown in FIG. 5, the die pads 512 of the semiconductor die 510 each have two or more micro-bumps 506. In the embodiment shown in FIG. 6, the die pads 512 of the semiconductor die 510 each have a single bump contact 514 which is large enough to contact both of the micro-bumps 506 on the bond pad 504. It will be appreciated that in another embodiment, the structure of FIG. 6 may be modified such that the bond pad 504 may be configured with the single large bump 514 and the die pad 512 configured with the multiple micro-bumps.

The present invention is thought to be applicable to a variety of integrated circuit packages. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A semiconductor device comprising:
    a substrate having opposing first and second surfaces and an interconnect structure extending between the first and second surfaces;
    a plurality of bond pads on the first surface, the plurality of bond pads electrically connected to the interconnect structure;
    two or more micro-bumps on each of the plurality of bond pads, the two or more micro-bumps on each bond pad arranged to electrically connect the bond pad to one die pad of a semiconductor die; and
    a plurality of external contacts on the second surface and electrically connected to the interconnect structure;
    wherein two of the plurality of bond pads are electrically connected to one of the external contacts, and the two of the plurality of bond pads are configured for connection to a single die pad of the semiconductor die.

2. The semiconductor device of claim 1, wherein each of the plurality of bond pads includes only two micro-bumps.

3. The semiconductor device of claim 1, wherein at least one of the plurality of bond pads includes more than two micro-bumps.

4. The semiconductor device of claim 1, wherein the micro-bumps are mushroom shaped and have top portions that are partial spheres.

5. The semiconductor device of claim 1, wherein the micro-bumps are mushroom shaped and have top portions with rectangular shaped cross-sections.

6. The semiconductor device of claim 5, wherein the rectangular shaped top portions of the micro-bumps each have a length of less than or equal to 22 µm and a width of less than or equal to 12 µm and bottom portions of the micro-bumps each have a length of less than or equal to 15 µm and a width of less than or equal to 5 µm.

7. The semiconductor device of claim 1, wherein the two or more micro-bumps on each bond pad are arranged to electrically connect the bond pad to one die pad of a semiconductor die via at least one bump on the one die pad of the semiconductor die.

8. The semiconductor device of claim 1, wherein the two or more micro-bumps on each bond pad are arranged to electrically connect the bond pad to one die pad of a semiconductor die via two or more micro-bumps on the one die pad of the semiconductor die.

9. The semiconductor device of claim 1, wherein the two or more micro-bumps on each of the plurality of bond pads is shaped as a partial sphere.

10. An integrated circuit package comprising:
    a substrate having opposing first and second surfaces and an interconnect structure extending between the first and second surfaces;
    a plurality of bond pads on the first surface, the plurality of bond pads electrically connected to the interconnect structure;
    two or more micro-bumps on each of the plurality of bond pads;
    a plurality of semiconductor die, each die having a plurality of die pads, each die pad electrically connected to a respective one of the plurality of bond pads via the two or more micro-bumps on the respective bond pad; and
    a plurality of contacts on the second surface of the substrate, the plurality of contacts electrically connected to the interconnect structure;
    wherein two of the plurality of bond pads are electrically connected to one of the plurality of contacts, and the two of the plurality of bond pads are connected to a single die pad of the plurality of die pads of the semiconductor die.

11. The integrated circuit package of claim 10, wherein the plurality of contacts are configured to electrically connect the die pads of the semiconductor dice to a mother board.

12. The integrated circuit package of claim 10, wherein the plurality of contacts are configured to electrically connect the die pads of the semiconductor dice to test circuitry for testing functionally of the semiconductor dice.

13. The integrated circuit package of claim 10, further comprising at least one bump on each of the die pads of the semiconductor dice, the at least one bump on each of the die pads connected to the two or more micro-bumps on a respective one of the plurality of bond pads.

14. The integrated circuit package of claim 13, wherein the at least one bump on each of the die pads of the semiconductor dice is the only bump on each of the die pads.

15. The integrated circuit package of claim 13, wherein the at least one micro-bump on each of the die pads include two or more micro-bumps on each of the die pads of the semiconductor dice.

16. The integrated circuit package of claim 10, wherein the two or more micro-bumps on each of the plurality of bond pads is shaped as a partial sphere.

17. A method for fabricating a semiconductor device, comprising:
    forming a plurality of bond pads on a first surface of a substrate, the substrate having the first surface and an opposing second surface and an interconnect structure extending between the first and second surfaces, and the plurality of bond pads being electrically connected to the interconnect structure;
    wherein two of the plurality of bond pads are configured for connection to a single die pad of a semiconductor die;
    forming two or more micro-bumps on each of the plurality of bond pads, the two or more micro-bumps on each bond pad arranged to electrically connect the bond pad to one die pad of the semiconductor die; and
    forming a plurality of external contacts on the second surface of the substrate, the external contacts being electrically connected to the interconnect structure, and one of the external contacts electrically being connected to the two of the plurality of bond pads via the interconnect structure.

18. The method of claim 17, wherein each of the plurality of bond pads includes only two micro-bumps.

19. The method of claim 17, wherein at least one of the plurality of bond pads includes more than two micro-bumps.

20. The method of claim 17, wherein the two or more micro-bumps on each bond pad are arranged to electrically connect the bond pad to the one die pad of the semiconductor die via at least one bump on the one die pad of the semiconductor die.

* * * * *